United States Patent
Liebmann et al.

(10) Patent No.: US 12,414,367 B2
(45) Date of Patent: Sep. 9, 2025

(54) TAPERED DEVICE FOR LATERAL GATE ALL AROUND DEVICES

(71) Applicant: Tokyo Electron Limited, Tokyo (JP)

(72) Inventors: Lars Liebmann, Mechanicville, NY (US); Jeffrey Smith, Clifton Park, NY (US); Daniel Chanemougame, Niskayuna, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 561 days.

(21) Appl. No.: 17/882,229

(22) Filed: Aug. 5, 2022

(65) Prior Publication Data

US 2023/0078381 A1 Mar. 16, 2023

Related U.S. Application Data

(60) Provisional application No. 63/244,287, filed on Sep. 15, 2021.

(51) Int. Cl.
*H10D 84/85* (2025.01)
*H10D 88/00* (2025.01)
*H10D 89/10* (2025.01)

(52) U.S. Cl.
CPC ........... *H10D 84/856* (2025.01); *H10D 88/01* (2025.01); *H10D 89/10* (2025.01)

(58) Field of Classification Search
CPC ...... H10D 84/856; H10D 89/10; H10D 88/01; H10D 30/6735; H10D 30/6757; H10D 30/014; H10D 84/038
See application file for complete search history.

(56) References Cited

U.S. PATENT DOCUMENTS

2020/0328210 A1* 10/2020 Wu ..................... H10D 84/0151
2021/0134795 A1* 5/2021 Ju ........................ H10D 64/518

* cited by examiner

*Primary Examiner* — Changhyun Yi
(74) *Attorney, Agent, or Firm* — Oblon, McClelland, Maier &Neustadt, L.L.P.

(57) ABSTRACT

Aspects of the present disclosure provide a semiconductor structure. For example, the semiconductor structure can include a lower channel structure, an upper channel structure formed vertically over the lower channel, a first transistor device including lower and upper gates formed around a first portion of the lower and upper channel structures, respectively, and a separation layer formed between and separating the lower and upper gates, and a second transistor device including a common gate formed around a second portion of the lower and upper channel structures. The first portion of the lower channel structure is equal to the first portion of the upper channel structure in width, and has a first width less than a second width of the second portion of the lower channel structure.

20 Claims, 13 Drawing Sheets

TAPERED DEVICE FOR LATERAL GATE ALL AROUND DEVICES

INCORPORATION BY REFERENCE

This present disclosure claims the benefit of U.S. Provisional Application No. 63/244,287, entitled "TAPERED DEVICE FOR LATERAL GATE ALL AROUND DEVICES" filed on Sep. 15, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a semiconductor structure. For example, the semiconductor structure can include a lower channel structure, an upper channel structure, a first transistor device and a second transistor device. The upper channel structure can be formed vertically over the lower channel structure. The first transistor device can include a lower gate formed around a first portion of the lower channel structure, an upper gate formed around a first portion of the upper channel structure, and a separation layer formed between and separating the upper gate and the lower gate. The second transistor device can include a common gate formed around a second portion of the lower channel structure and a second portion of the upper channel structure. The first portion of the lower channel structure can be equal to the first portion of the upper channel structure in width. The second portion of the lower channel structure can be equal to the second portion of the upper channel structure in width. The first portion of the lower channel structure can have a first width less than a second width of the second portion of the lower channel structure.

In an embodiment, the upper gate can be formed all around a cross-section of the upper channel structure, the lower gate can be formed all around a cross-section of the lower channel structure, and the common gate can be formed all around cross-sections of the upper channel structure and the lower channel structure.

In an embodiment, the upper channel structure and the lower channel structure can have a channel width transition between the first transistor device and the second transistor device. For example, the channel width transition can be positioned at a contacted poly pitch (CPP). In another embodiment, the channel width transition is step-shaped. For example, the step-shaped channel width transition can be symmetrical with respect to a central line of the upper channel structure and the lower channel structure.

In an embodiment, the semiconductor structure can further include a power rail positioned below the first transistor device and the second transistor device. The power rail can have a width corresponding to the widths of the upper channel structure and the lower channel structure.

In another embodiment, the semiconductor structure can further include a lower gate contact connected to the lower gate. A difference between the first width and the second width can be sufficient for the lower gate contact to extend from the lower gate to a wiring plane above the first transistor device.

In some other embodiments, the semiconductor structure can further include a third transistor device that is adjacent to at least one of the first transistor device and the second transistor device. The lower channel structure and the upper channel structure at the third transistor device can have a third width different from at least one of the first width and the second width.

Aspects of the present disclosure also disclose a method of manufacturing a semiconductor structure. For example, the method can include forming a mandrel over a semiconductor material layer stack, forming at least a sidewall spacer on a portion of the mandrel, using the mandrel and the at least a sidewall spacer to define channel structures in the semiconductor material layer stack, forming from the semiconductor material layer stack a first transistor device that includes a first portion of the channel structures that corresponds to the sidewall spacer and the portion of the mandrel, and forming from the semiconductor material layer stack a second transistor device that includes a second portion of the channel structures that corresponds to a remaining of the mandrel.

In an embodiment, forming at least a sidewall spacer can include forming two sidewall spacers. For example, the two sidewall spacers can be formed on two sides of the portion of the mandrel. As another example, the two sidewall spacers can be formed on one side of the portion of the mandrel.

In another embodiment, forming at least a sidewall spacer on a portion of the mandrel can include forming at least a first sidewall spacer on a portion of the mandrel, and removing a portion of the at least a first sidewall spacer that is formed on a remaining of the mandrel.

Aspects of the present disclosure also disclose another method of manufacturing a semiconductor structure. For example, the method can include forming a lower channel structure, forming an upper channel structure vertically over the lower channel structure, forming a first transistor device that includes a lower gate formed around a first portion of the lower channel structure, an upper gate formed around a first portion of the upper channel structure, and a separation layer formed between and separating the upper gate and the lower gate, and forming a second transistor device that includes a common gate formed around a second portion of the lower channel structure and a second portion of the upper channel structure. The first portion of the lower channel structure can be equal to the first portion of the upper channel structure in width. The second portion of the lower channel structure can be equal to the second portion of the upper channel structure in width. The first portion of the lower channel structure can have a first width less than a second width of the second portion of the lower channel structure.

In an embodiment, the upper channel structure and the lower channel structure can have a channel width transition between the first transistor device and the second transistor device. For example, the channel width transition can be positioned at a CPP. As another example, the channel width transition can be step-shaped.

In another embodiment, the method can further include forming a lower gate contact connected to the lower gate. A difference between the first width and the second width can be sufficient for the lower gate contact to extend from the lower gate to a wiring plane above the first transistor device.

In some other embodiments, the method can further include forming a third transistor device that is adjacent to at least one of the first transistor device and the second transistor device. The lower channel structure and the upper channel structure at the third transistor device can have a third width different from at least one of the first width and the second width.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
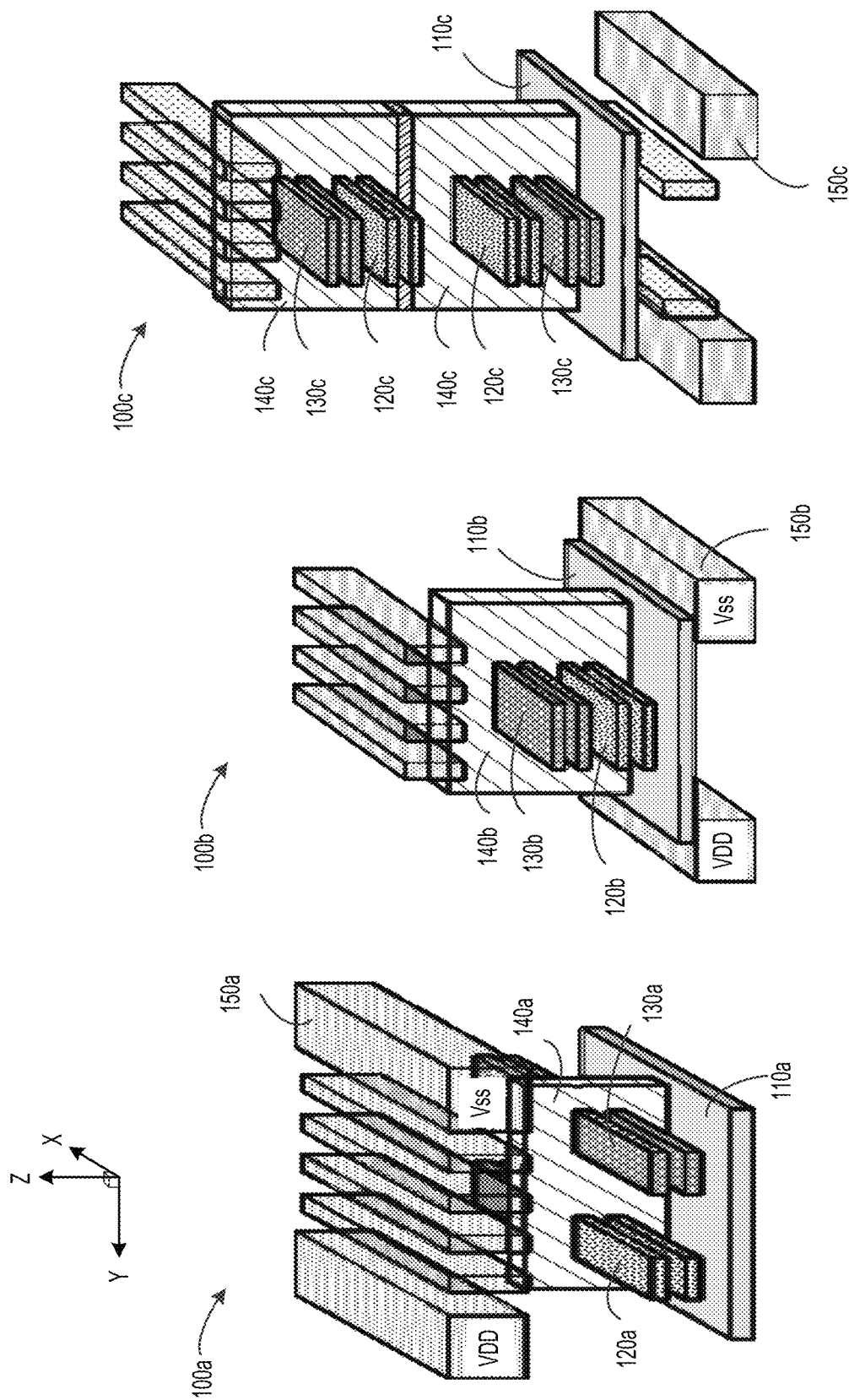
FIG. 1 shows a simplified cartoon of the device progression from nanosheet (NS) (left), to complementary FET (CFET) (middle), to stacked CFET (right)

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

Techniques herein related to scaling of VLSI logic circuits. In particular, such techniques enable scaling of logic standard cells used to render combinatorial and sequential logic functions in the majority of digital design flows used in microelectronics designs. Embodiments herein also enable increasing transistor density in digital logic designs by means of reducing cell height. Cell height in standard cell logic is reported in numbers of wiring tracks, i.e. the number of minimum pitch wiring tracks available for routing (i.e. to connect transistors to each other and to the input and output pins). Reducing cell height from 7 T to 3.5 T while maintaining the same cell width amounts to 50% area scaling or 2× density improvement. Techniques herein also disclose designs and methods that maintain high drive-strength in small cell height. This includes wiring track limited logic cells implemented with complimentary FET (CFET) devices by locally adjusting the device width.

Techniques herein can be implemented with lateral gate-all-around (GAA) transistor devices. These devices have a channel structure having a current flow direction that is parallel to a working surface of a substrate (wafer). The channel structure also includes a gate that wraps all around a cross section of the channel. Such techniques can be applied to vertically stacked transistors. For example, a CFET device includes N and P devices that are positioned (stacked) on top of each other for area scaling.

CFET can enable scaling beyond nanosheets by enabling low track-height cells. One limiting factor, however, is wiring access to bottom gates while maintaining wide device width for high drive-strength. To address this challenge, techniques herein use a tapered device and integration flow. Techniques herein use a spacer-based integration flow to selectively narrow device width where access to bottom gates is needed. Using tapered devices (i.e. a selective change in device width) herein maximizes drive strength (i.e. overall device width) while locally enabling increased device connectivity. Variable channel width transitions designs and techniques herein can but used for lateral gate-all-around (LGAA) devices, nanosheet devices including side-by-side devices, as well as CFET and stack CFET devices.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

FIG. 1 shows a simplified cartoon of the device progression from nanosheet (NS) 100a, also known as lateral gate all-around (LGAA) (left), to complementary FET (CFET) 100b (middle), to stacked CFET 100c (right). The device progression moves from a side-by-side channel arrangement, as seen in NS, to a vertically stacked channel arrangement, as seen in CFET, allowing the device footprint to be reduced while maintaining or increasing channel width. Further transistor density scaling can be achieved through more vertical stacking, as shown in stacked CFET. Each device architecture in turn enables higher transistor density to be achieved in VLSI circuits. The NS 100a includes a substrate 110a disposed in an XY plane, for example, an N channel 120a and a P channel 130a disposed side-by-side over the substrate 110a in Z-direction, a common gate 140a disposed around the N channel 120a and the P channel 130a, and power rails 150a including VDD and Vss extending in X-direction. The CFET 100b includes a substrate 110b, an N channel 120b and a P channel 130b disposed vertically over the substrate 110b, a common gate 140b disposed around the N channel 120b and the P channel 130b, and power rails 150b including VDD and Vss. The stacked CFET 100c includes a substrate 110c, a lower CFET disposed over the substrate 110c, an upper CFET stacked over the lower CFET, and power rails 150c. The lower CFET includes a P channel 130c and an N channel 120c disposed vertically over the substrate 110c, and a common gate 140c disposed around the P channel 130c and the N channel 120c. The upper CFET also includes the common gate 140c, the P channel 130c and the N channel 120c. In the upper CFET, the P channel 130c is disposed over the N channel 120c.

Figure 2:
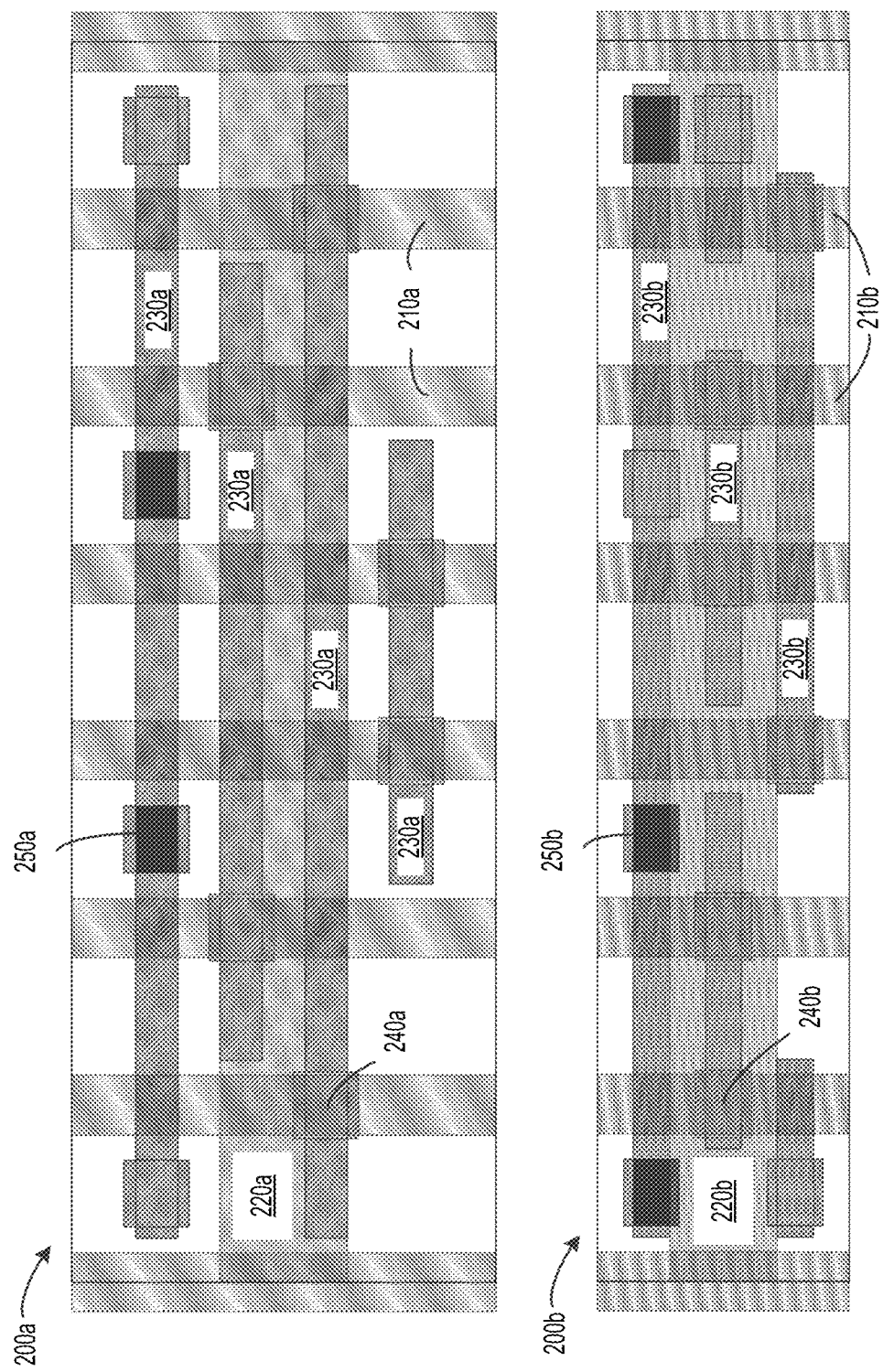
FIG. 2 shows the layout of a typical combinatorial logic cell in 5-track (top) and 3.5 track (bottom) cell height implemented in a CFET device architecture.

FIG. 2 shows the layout of a typical combinatorial logic cell in 5-track 200a (top) and 3.5 track 200b (bottom) cell height implemented in a CFET device architecture. Lines from top to bottom are polysilicon (or poly) 210a and 210b. Active channels 220a and 220b extend from left to right through the center. Narrower segments extending from left to right are metal 230a and 230b. Squares show gate contacts 240a and 240b and source/drain (S/D) contacts 250a and 250b. FIG. 2 illustrates how reducing the device footprint by stacking the complementary N and P channels vertically rather than placing them laterally, allowing further transistor density improvement through cell height reduction. The limiting factor now is the number of available wiring tracks to connect the transistors into the desired logic functions. As shown in FIG. 2, the 5-track cell has 4 available wiring channels while the 3.5 T cell only has 3.

Conventionally, a majority of transistors used to render combinatorial or sequential logic use a "common gate", that is, as illustrated in FIG. 1, a single gate structure surrounding both P and N channels. Some logic functions, however, such as pass-gate logic, benefit from split gates, which are separate and independently contacted gates for the N and P channels.

Figure 3:
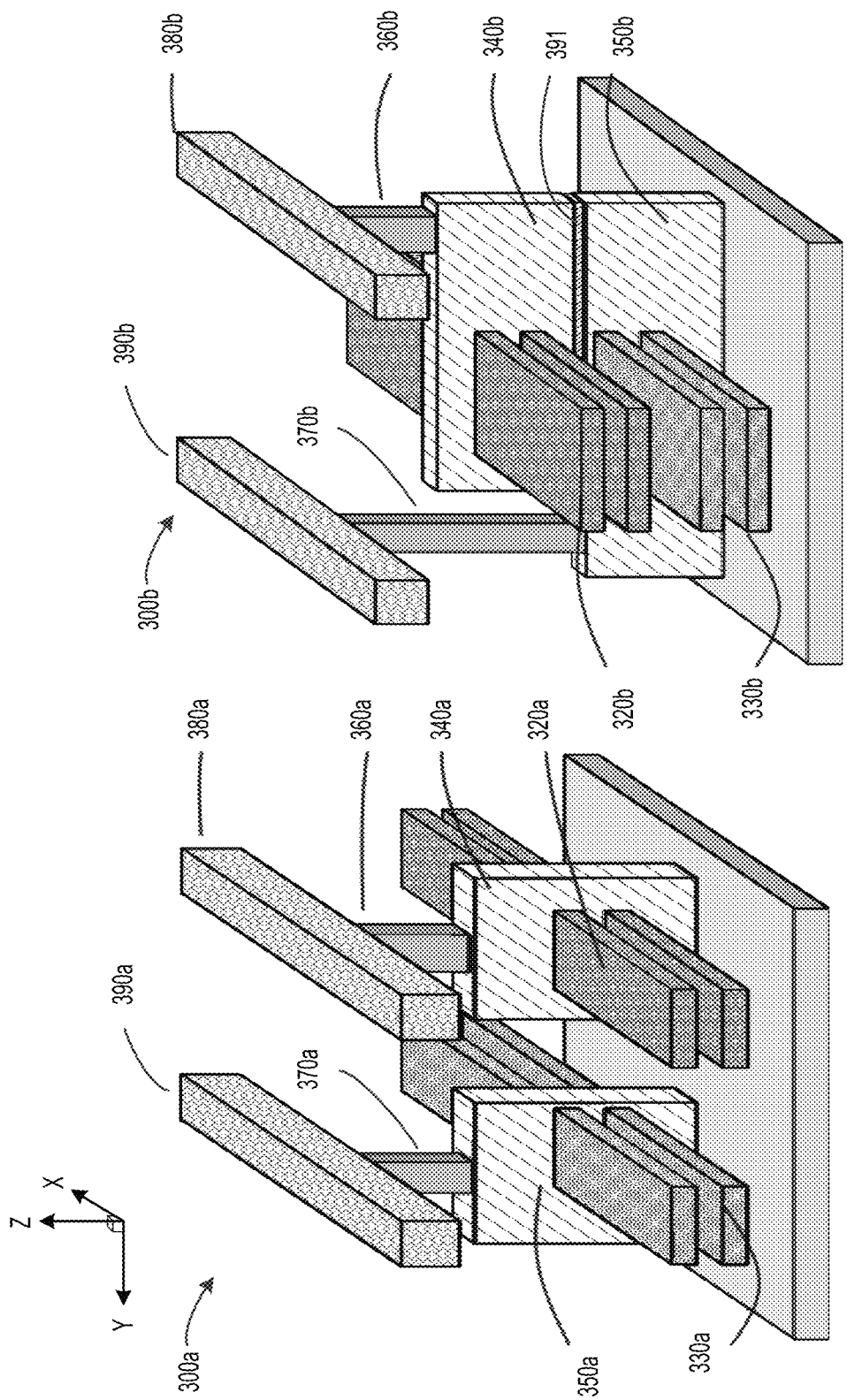
FIG. 3 shows NS (left) and CFET (right) devices that include split gates.

FIG. 3 shows an NS device 300a (left) and a CFET device 300b (right) that each include split gates. In the NS device 300a, it is straightforward to separate an N gate 340a and a P gate 350a that are disposed around an N channel 320a and a P channel 330a, respectively. For example, a polysilicon gate can be cut in order to disconnect the N and P gates 340a and 350a where desired, typically in the middle of the cell (hereinafter referred to as an "N and P separation space"), and N and P gate contacts 360a and 370a can be formed on the N and P gates 340a and 350a, respectively, and connected to respective local interconnects, e.g., the first metal layers (M0) 380a and 390a. In the CFET device 300b, as the N and P separation space must now be made in the vertical plane (e.g., in a YZ plane) instead of the horizontal plane (e.g., in an XY plane) and the lower and upper gates, e.g., the P and N gates 350b and 340b, need to be independently contacted by respective local interconnects (e.g., the first metal layer (M0) 390b and 380b, respectively), the upper gate (e.g., the N gate 340b) and the lower gate (e.g., the P gate 350b) are separated by an dielectric separation layer 391, and are in a staircase configuration such that the lower gate contact (e.g. the P gate contact 370b) can connect to the first metal layer (M0) 390b without interfering the upper gate 340b. For example, the upper gate 340b needs to be trimmed (i.e. reduced in length in Y-direction) to allow the lower gate contact 370b to pass by the end of the upper gate 340b. In large cells (i.e. high track count cells such as the 5-track cell shown in the top of FIG. 2), this limits the lower gate contact 370b to the outer wiring tracks, because the inner two tracks sit over the active channel, making it impossible to trim back the upper gate 340b. Reducing the cell height while keeping the same device width, as shown in the 3.5-track cell shown in the bottom of FIG. 2, ultimately blocks all wiring tracks from accessing the lower device in a split-gate configuration.

Figure 4:
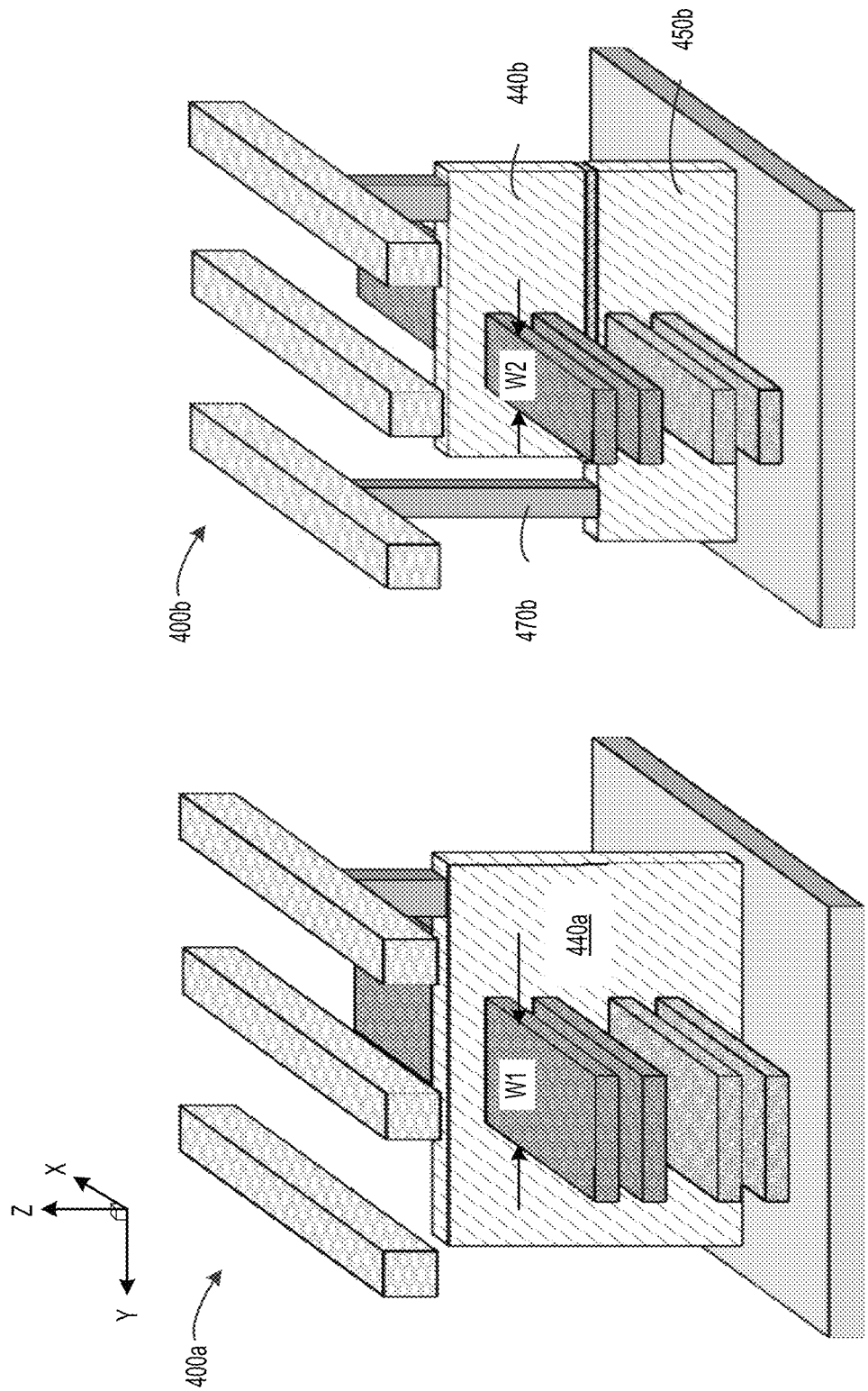
FIG. 4 shows a CFET device (left) that has a common gate configuration and another CFET device (right) that has a split-gate configuration with reduce device width in order for a lower gate contact to reach and past the end of an upper gate.

According to the present disclosure, in order to enable split-gate configurations in aggressively scaled CFET layouts, the device width is selectively narrowed, e.g. where necessary to open up the separation space for lower gate contacts to reach and past the end of the upper gate. For example, FIG. 4 shows a CFET device 400a (left) that has a common gate 440a so that the device width is still W1, without reduced, and another CFET device 400b (right) that has a split-gate configuration, including upper and lower gates 440b and 450b, so that the device width is reduced to W2 in order for the lower gate contact 470b to reach and past the end of the upper gate 440b.

Figure 5:
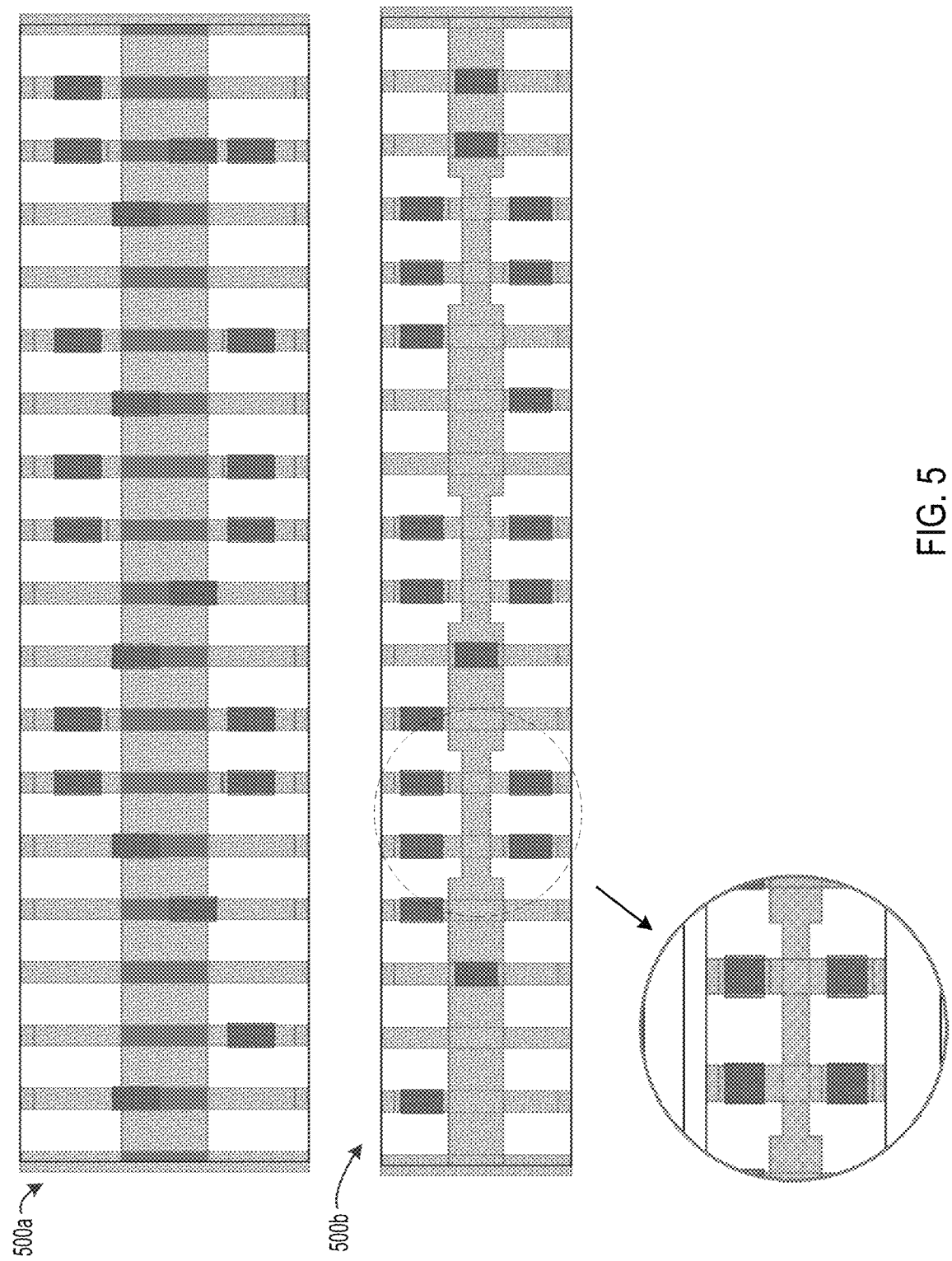
FIG. 5 illustrates the application of this disclosure to a real sequential logic cell design.

To illustrate the application of this disclosure to a real sequential logic cell design, FIG. 5 shows a 5-track 500a (top) and 3.5-track 500b (middle) rendering of a flip-flop with the 3.5-track cell selectively narrowing the device width (which is enlarged and shown in the bottom of FIG. 5) only where access to the lower device—independently of the upper device—is needed. The 3.5-track can correspond to the CFET device 400b shown in FIG. 4.

Figure 6:
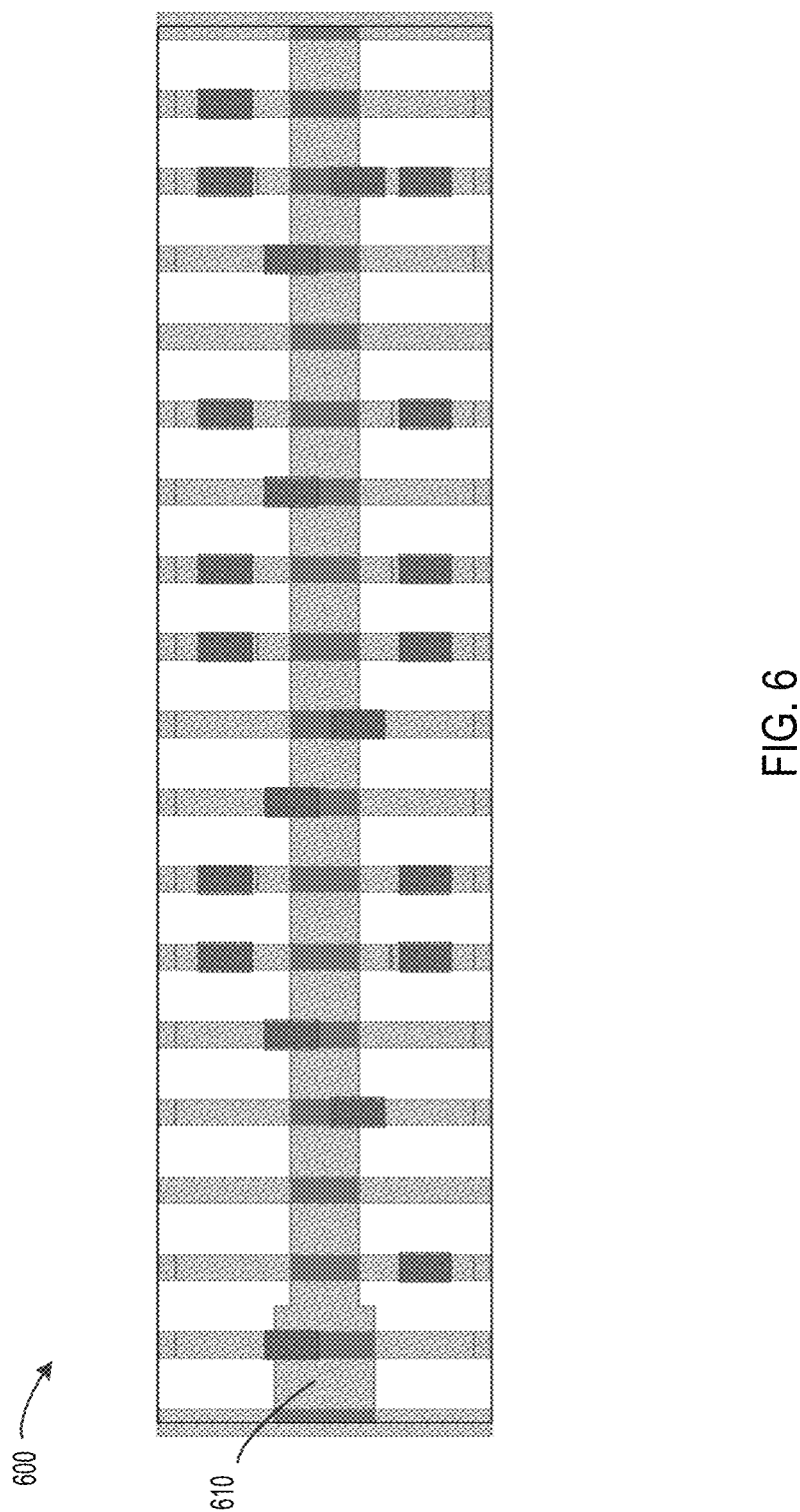
FIG. 6 shows an alternative application of the tapered device in accordance with some embodiments of the present disclosure.

FIG. 6 shows an alternative application of a tapered device 600 in which only an output driver 610 is widened to increase drive strength while all other devices are kept narrow to conserve power consumption. In the example, out of the 15 active transistor pairs that make up this flip-flop design, only one transistor pair (e.g. the output inverter on the far left) predominantly affects overall circuit performance and significantly benefits from a wider active channel.

Figure 7:
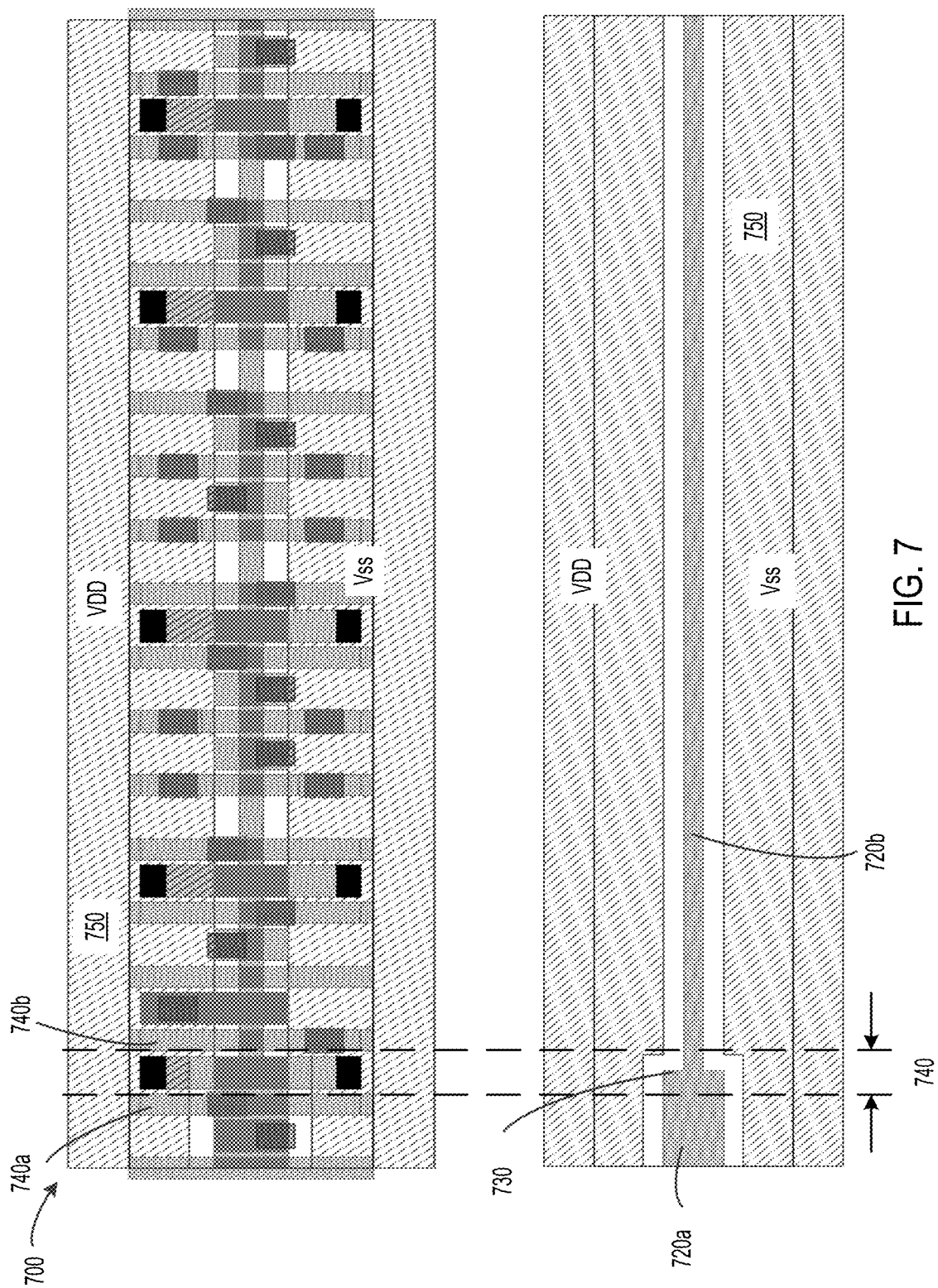
FIG. 7 shows an application of the tapered device to the optimization of buried power rail in accordance with some embodiments of the present disclosure.

A further aspect of a disclosed tapered device 700 is the derivative optimization of the buried power rail (BPR) 750 (e.g. VDD and Vss), as shown in FIG. 7. A "buried" power rail is a power rail that is positioned below active devices, such as in bulk silicon. Conventionally, power rails are formed in the metal wiring layers above active devices. To minimize IR drop (i.e. voltage drop due to excessive current load on a high resistance power supply), the power rail should be designed at maximum width. Using a self-aligned buried power-rail process, the tapered devices 500a, 500b and 600 of FIGS. 5 and 6 translate into a tapered power rail 750 that, by maintaining constant offset to the active device channel, which includes a wide active channel 720a and a narrow active channel 720b, maximizes width without interfering with the active devices.

The tapered device constructed herein is preferably formed so that a transition 730 (or a channel width transition) from wide nanosheet to narrow nanosheet occurs reliably within a transition space 740 between two gates (e.g., gates 740a and 740b that sandwich the transition space 740) placed at the contacted poly pitch (cpp). With leading-edge technology nodes approaching 40 nm cpp, this is a non-trivial challenge.

Figure 8B:
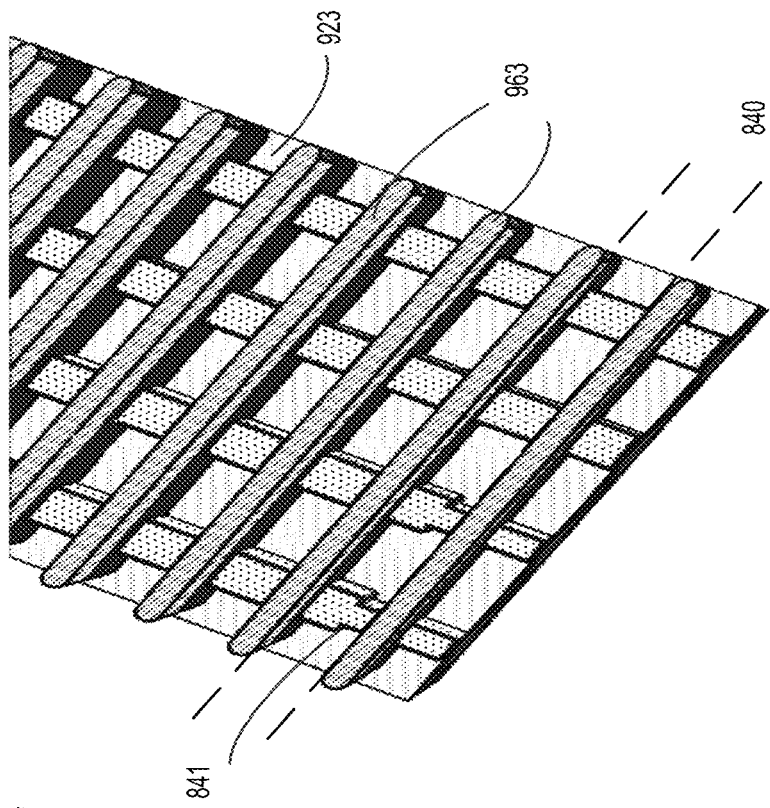
FIG. 8b shows transition points that are step-shaped in accordance with some embodiments of the present disclosure.
Figure 8A:
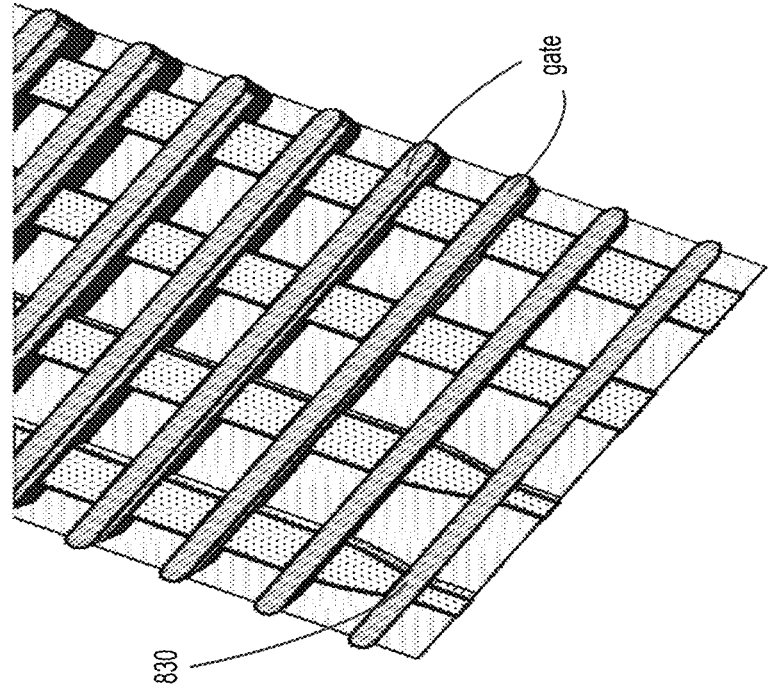
FIG. 8a shows corner rounding of the transition point.

Accordingly, methods herein enable a variable width nanosheet (e.g. silicon/silicon germanium nanosheet stack) patterned such that any transition of the width of the nanosheet is captured outside of the intended transistor area (i.e. gate regions), within a space between two devices at tight cpp. Even the most advanced single exposure EUV processing may not be a solution to pattern the variable nanosheet width for cases in which contacted poly pitch (CPP) is small (approaching or smaller than 40 nm). With single exposure EUV processes, the normal corner rounding of such transition points (i.e. varied between 11 nm and 21 nm) in the nanosheet width may extend into the intended gate area, thus driving variability of the channel width within the transistor (i.e. gate regions) which will have negative impact to the device function. As a result, some of the transition 730 in channel width are still increasing or decreasing as the channel enters the intended gate area, e.g., between the gates 740a and 740b. This is illustrated in FIG. 8a.

The transition point of the change in width of the silicon/silicon germanium nanosheet stack must also take into account any edge placement error of the integration. For example, the placement of the intended gates done by self-aligned double patterning methodology will have placement error associated with alignment tolerances of lithographic equipment as well as pitch-walking associated with the individual steps of the self-aligned double patterning integration. This effect will drive further critical variability in the channel width within each transistor of the device for the case of single exposure EUV patterning of the nanosheet structures.

This enforces the necessity for the nanosheet width transition to be confined to a very small distance. Preferably a step-increase (or step-like) transition 830 is best preferred as this has the best possible tolerance for the step size increase or decrease to exist within the area (e.g., a transition space 840) between the intended gate structures and not within the transistor itself, as shown in FIG. 8b, which shows a desired transition profile of the nanosheet width. For example, the intended channel width is also varied between 11 nm and 21 nm. Removing the typical corner rounding profiles exhibited by single exposure EUV patterning is crucial to prevent any continuation of the extension of the nanosheet width within the transistor and to confine the width increase to the area between transistors.

This disclosure covers such methods to form transitions in the nanosheet width within the areas (i.e. the transition space) between the transistors through a spacer-based process. This process will allow for the step-like transitions in the nanosheet width. This methodology can also be extended beyond simple nanosheet processing and be extended to other critical structures as well, including gate structures, metal structures, and interconnect structures. For convenience in describing embodiments herein, this disclosure focuses on the formation of a variable width nanosheet.

Incorporating a spacer-based solution provides a number of options which would not be available through single exposure EUV processing. One option is symmetrical step-increases in nanosheet widths, as shown in FIG. 8b. That is, the transition occurs where the nanosheet width is increased or decreased equally from both sides of the nanosheet. Another option is assymetric step-increases in nanosheet widths. This transition occurs where the nanosheet width in increased or decreased from only one side of the nanosheet. Options for multiple nanosheet widths can be incorporated through the use of additional spacers or through a sequential hardmask process where the spacer process is repeated.

The illustrations below show an example of how a single symmetrical transition from a "narrow" to "wide" nanosheet structure can be implemented with current processing technologies. This illustration shows only for the case of a single, symmetrical transition. As can be appreciated, a similar process integration can be used to make multiple transition widths, both symmetrically and asymmetrically.

Figure 9:
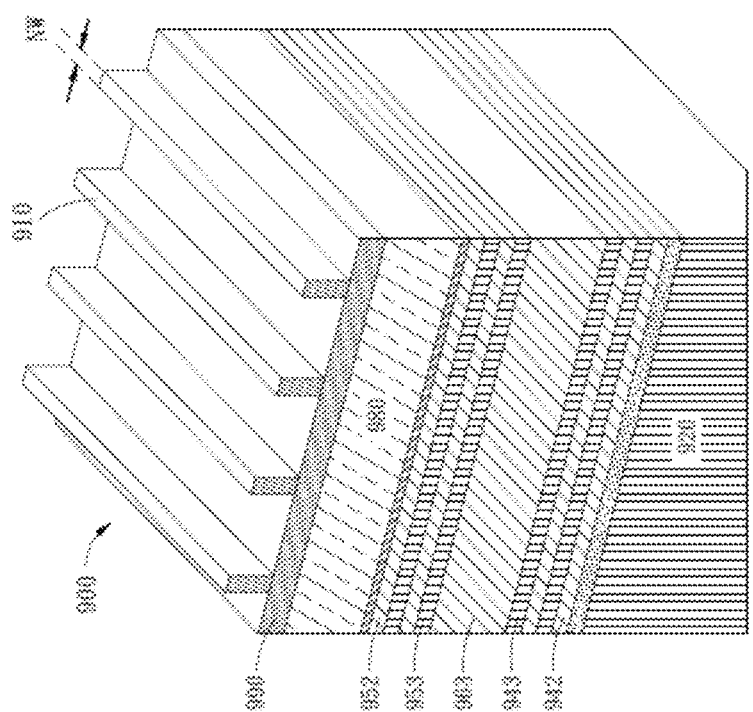

In one embodiment a backbone or mandrel structure 910 of a substrate segment (or a semiconductor structure) 900 is patterned with a minimally sized intended nanosheet structure as shown in FIG. 9. For the purpose of this illustration, the backbone size is set to 11 nm in width for what will be called the "narrow" intended nanosheet width (or narrow width NW). Any suitable backbone material can be used for the process integration. An end objective is to memorize a final variable nanosheet pattern into silicon nitride over the silicon/silicon germanium epitaxial lattice to keep with existing front-end-of-the-line (FEOL) process integrations involving shallow trench isolation methodology. Preferably the backbone structures 910 themselves are composed of silicon nitride with a thin amorphous hardmask underneath to simplify the overall process integration. It is notes, however, that many materials can be used as this backbone or mandrel material. Preferred selection of materials is to enable processes herein to be compatible with the current down-stream FEOL integrations.

The semiconductor structure 900 can include a first (or lower) channel structure 942 disposed over a substrate 920 of a wafer, and a second (or upper) channel structure 952 disposed over the lower channel structure 942. The lower channel structure 442 can include one or more first (or lower) silicon/silicon germanium nanosheets (or nanosheet stack) or nanowires. The lower nanosheets or nanowires can be stacked over the substrate 920 and spaced apart from one another by a lower insulating layer 943. The upper channel structure 952 can also include one or more second (or upper) silicon/silicon germanium nanosheets (or nanosheet stack) or nanowires. The upper nanosheets or nanowires can be stacked over the lower channel structure 942 and spaced apart from one another by an upper insulating layer 953. A cap layer (e.g. tetra-ethyl-ortho-silane, TEOS) 980 and a hardmask (e.g. amorphous silicon or silicon nitride) 990 are formed over the upper channel structure 952 sequentially.

Figure 10:
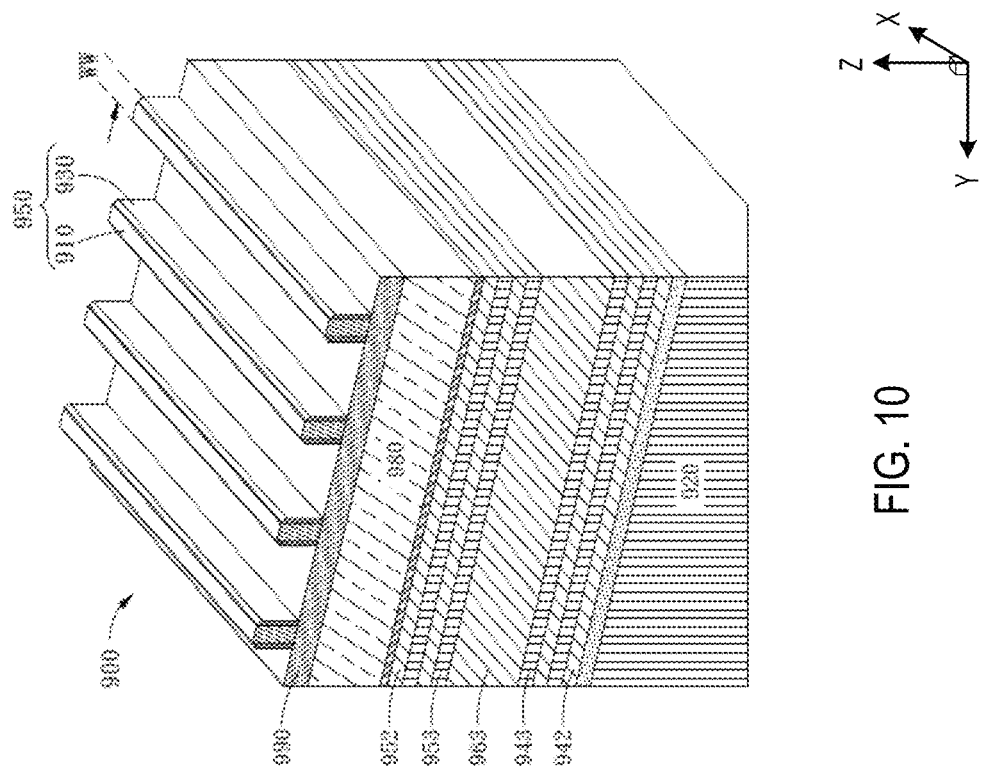
FIGS. 9 to 18 show a method of manufacturing a semiconductor structure in accordance with some embodiments of the present disclosure.

As shown in FIG. 10, a sidewall spacer process can be used to form a sidewall spacer 930 to increase a width of the pattern to the wide nanosheet target 950, which will be set arbitrarily to 21 nm (i.e. wide width WW) in this example. The material choice of spacer material is done to be consistent with the down-stream integration and multiple materials can be used in combination with the choice of the backbone or mandrel material. In an embodiment, silicon oxide is used as the spacer choice and set the thickness to an arbitrary size of 5 nm. This example uses a single deposition of sidewall spacer 930 in order to allow for one transition in the nanosheet width. In other embodiments, however, multiple "colors" or materials of spacers can be used. That is, multiple spacers of different material selection are formed in order to provide for multiple transitions in the nanosheet width. In adding additional sidewall spacer materials, it is important to provide for that each spacer will need to have etch selectivity between the other spacer materials as well as to the backbone and underlying hardmask floor. Such material selection and etch selectivities are conventionally known including the various etch chemistries to etch one material without etching other materials.

Figure 11:
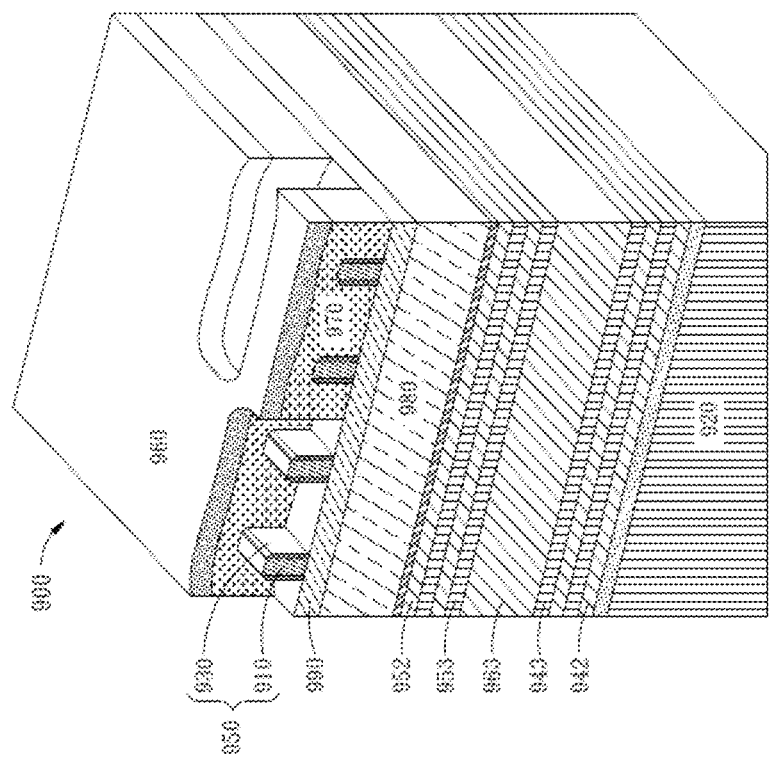

As shown in FIG. 11, a blocking mask 960 is then formed over the backbone/mandrel 910 and the spacer structure 930. The blocking pattern uncovers portions of the nanosheets 942/943/952/953 (in which a transition from "wide" to "narrow" is desired) to be narrowed by removal of one or more sidewall spacers 930. Given the relatively larger pitch of the nanosheet structures 942/943/952/953 relative to the contacted poly pitch, the block pattern (etch mask) 960 can be patterned large enough such that any corner-rounding of the blocking pattern 960 does not extend to overlap the nanosheet structures 942/943/952/953 which are opened during the subsequent reveal etching process.

For symmetrical nanosheet width transitions, both sides of the wide nanosheet target 950 will be uncovered by the blocking process. For the case of asymmetrical nanosheet width transitions, the blocking pattern is formed such that the sidewall of the opened area of the blocking mask 960 lands on the backbone material 910. Based on typical corner rounding capability of different lithographic techniques, there may be some limitation of making asymmetric transitions based on the intended size of the "narrow" nanosheet width which is defined by the starting backbone width. At larger scales this is not a concern.

Figure 12:
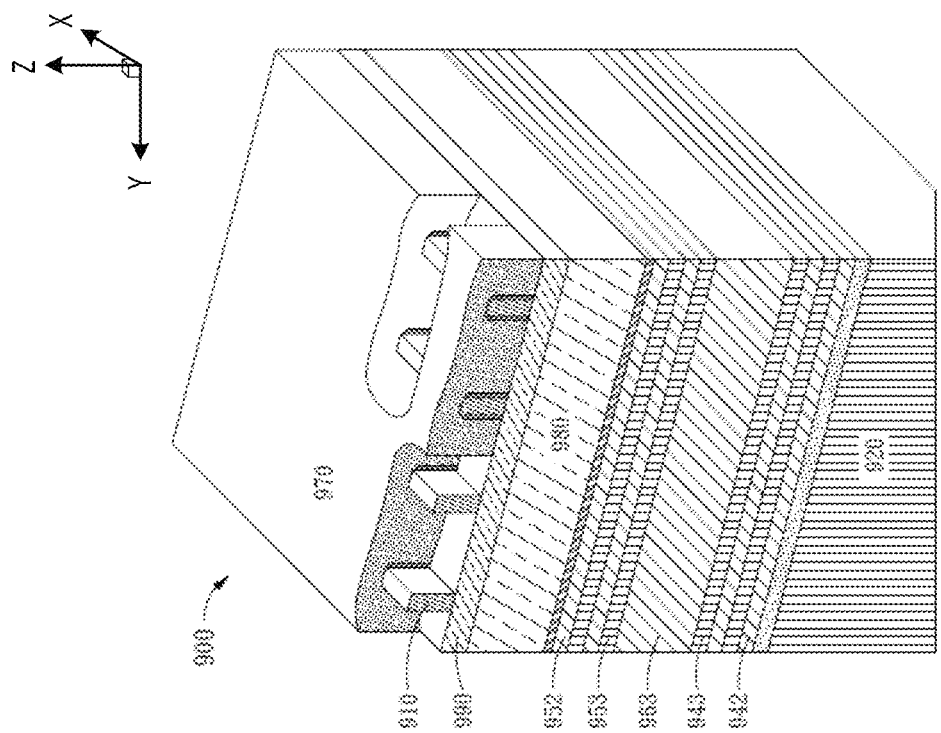

As shown in FIG. 12, the sidewall spacers 930 are then anisotropically etched away, and the blocking mask 960 is removed. In an embodiment, the sidewall spacers 930 are made of a silicon oxide because the anisotropic etch of the spacers 930 also allows for the simultaneous removal of the oxide based layer overtop the spin-on-organic film 970. In other embodiments, however, multiple sidewall spacer materials can be used to form sidewall spacers on the mandrels.

Note that this method illustrates a subtractive process. That is, the sidewall spacers 930 are added to a mandrel 910 and then selectively removed at particular locations. This tunes nanosheet width by etching away the sidewall spacer 930 in the desired region. Additive processes can also be used herein. In an additive process, a particular region of the mandrel 910 is uncovered (in which a transition from "wide" to "narrow" is desired), and then the sidewall spacers 930 are formed on the uncovered mandrel 910. An additive process can provide more flexibility in allowing for multiple nanosheet widths without requiring multiple sidewall spacer chemistries.

To enable this technique to work across multiple nanosheet transitions, multiple sidewall spacers 930 must be employed as well as multiple block masks 960 in order to form the multiple transition points. The multiple sidewall spacers 930 may include a wide sidewall spacer and a narrow sidewall spacer, and the wide sidewall spacer may include a single material that is the same as the narrow sidewall spacer or include multiple materials that include the material used by the narrow sidewall spacer. For example, one block pattern to remove only the wide sidewall spacer, an additional block pattern to remove both wide and narrow sidewall spacers, and so forth. With an additive process, the wide sidewall spacer can be formed using a single material, or multiple sidewall spacer depositions and spacer open etches can be executed until reaching a desired width for nanosheets formation.

Figure 13:
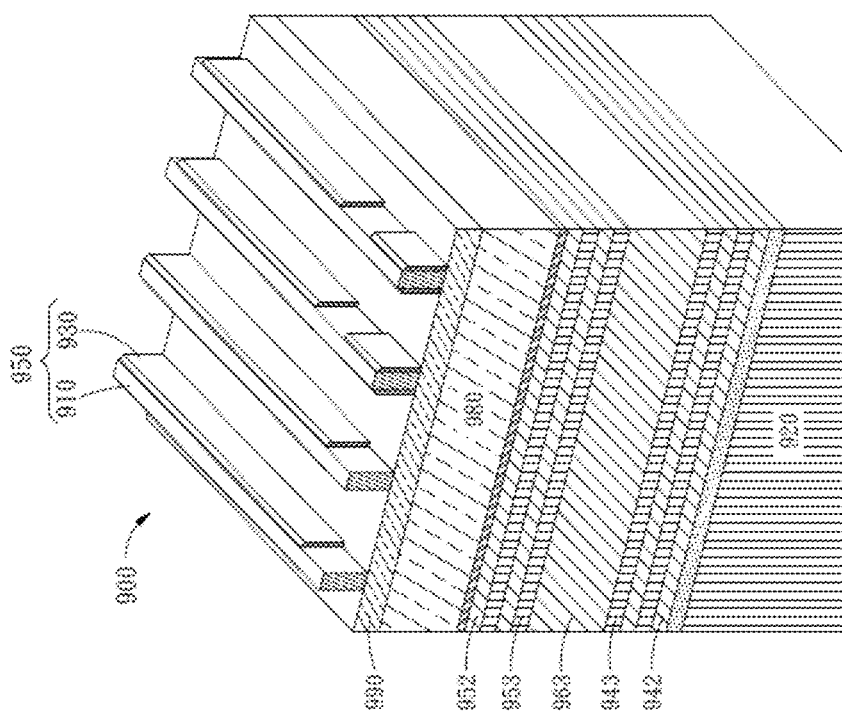

As shown in FIG. 13, the removal of the spin-on-organic material 970 uncovers the variable nanosheet pattern contained in the backbone target 950 with and without the sidewall spacers 930.

Figure 14:
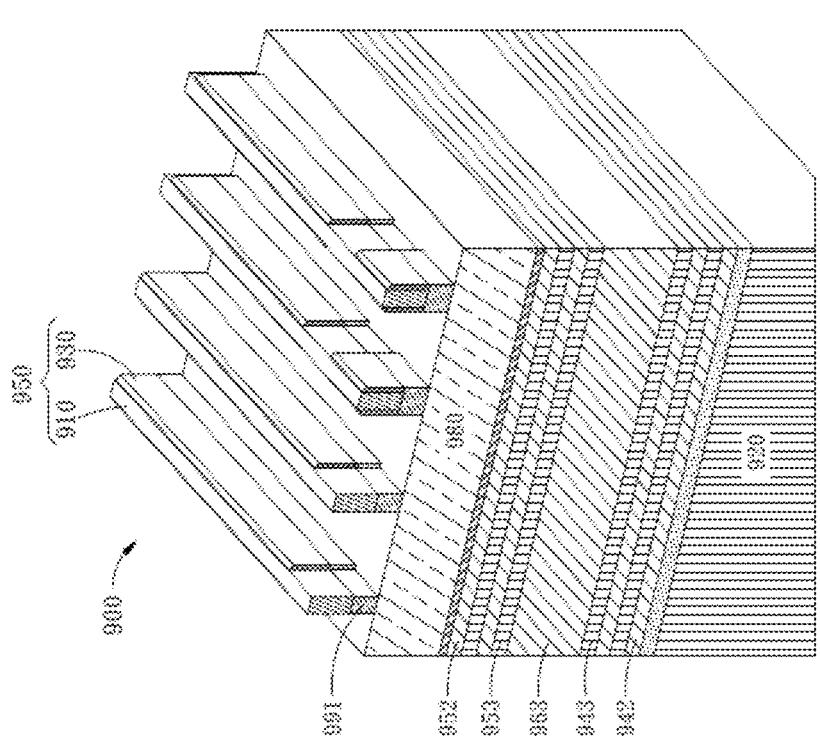

As shown in FIG. 14, the backbone 910 and variable sidewall spacer 930 need to be transferred to an underlying hardmask (i.e. hardmask 990) to form a variable nanosheet width pattern mask 991 (or a secondary hardmask). In this example, an amorphous silicon hardmask 990 is used to transfer the variable nanosheet width pattern. However, a number of different hardmask materials can be selected. Choice of amorphous silicon allows for the easy removal of the backbone 910 and the sidewall spacer materials 930.

Figure 15:
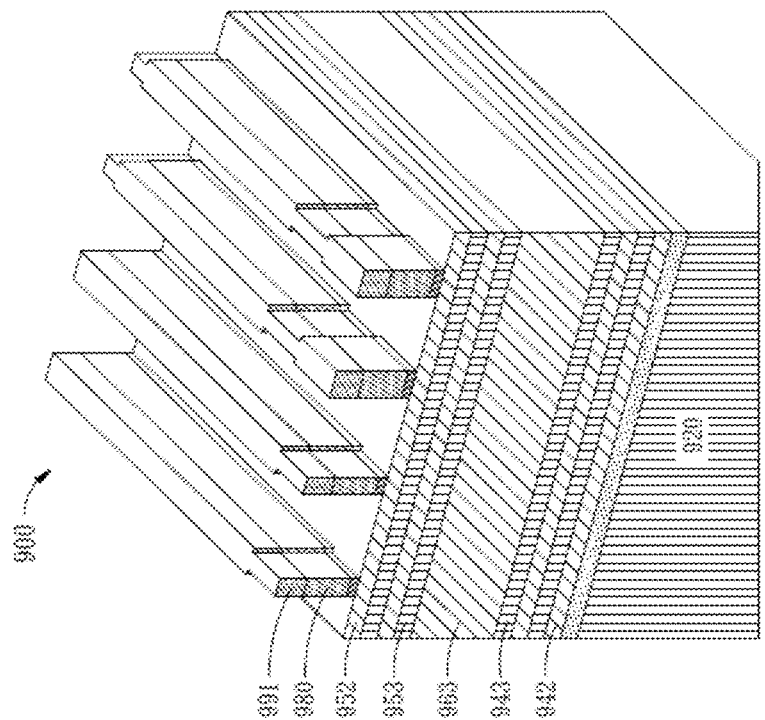

As shown in FIG. 15, the memorized pattern (i.e. the backbone 910 and variable sidewall spacer 930) is transferred from the secondary amorphous silicon hardmask 991 to the final silicon nitride hardmask 980 to form a final primary variable nanosheet width pattern mask 981, in which a non-selective etch process between silicon nitride (i.e. the hardmasks 980 and 990) and silicon oxide (i.e. the sidewall spacer 930) is used, which removes the backbone 910 and the sidewall spacer materials 930 during the transfer into the primary silicon nitride hardmask 980, thereby removing any need to include additional etch and cleans steps between the transfer of the pattern into the amorphous silicon hardmask 991 and the transfer into the silicon nitride final hardmask 981.

Figure 16:
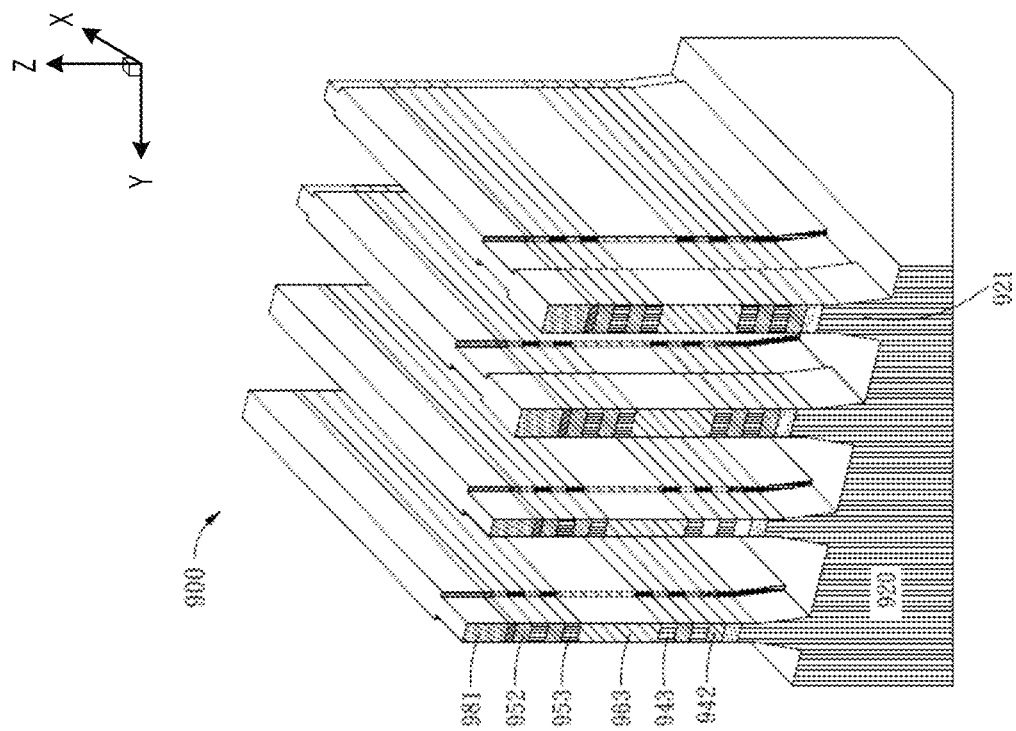

As shown in FIG. 16, in the FIN etching process to form fin structures 921 of the semiconductor structure 900 the amorphous silicon hardmask 991 is removed simultaneously, thus removing the necessity of having to employ additional etch and cleans steps to remove the secondary hardmask 991 from the primary silicon nitride hardmask 981. Again, this is an optional implementation of the process herein, but is shown in this example to simply the process integration and cost of the process.

Figure 17:
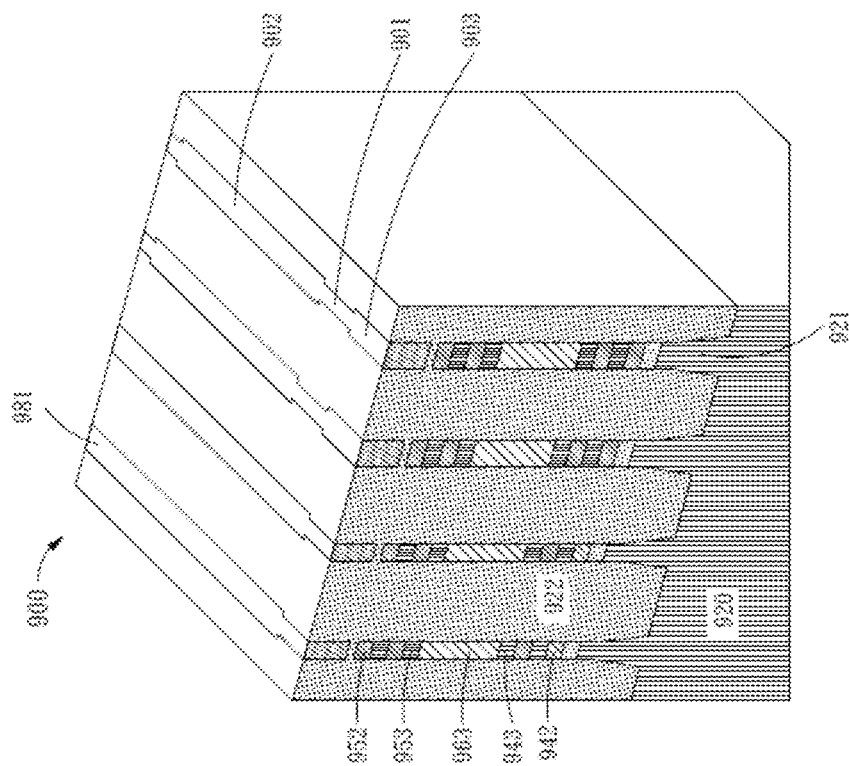

As shown in FIG. 17, in the shallow trench isolation (STI) process, the area between the silicon/silicon germanium fin structures 921 within the bulk silicon region will be filled with silicon oxide 922.

Referring back to FIG. 8b, a liner (e.g. chemical oxide) 923 is formed over the fin structures 921, and gate structures 963 will then be formed to define the transistor areas of the semiconductor structure 900. As can be seed in FIG. 8b, the sharp (e.g. staircase configuration) transition from the "narrow" to "wide" nanosheet width can be seen to be fully encompassed within the region between the gate structures 963, preventing any continuing transition in the channel width to be within the transistor. The transition in nanosheet width can accommodate normal process variability of the downstream integration, including variation in placement of the gate structures 963 through typical alignment tolerances of lithographic equipment, distortion effects associated with any heterogeneous integration process through wafer bonding if this example is done for a complimentary FET device, and through typical pitch walking of the gate patterning as done by self-aligned double patterning methods.

Figure 18:
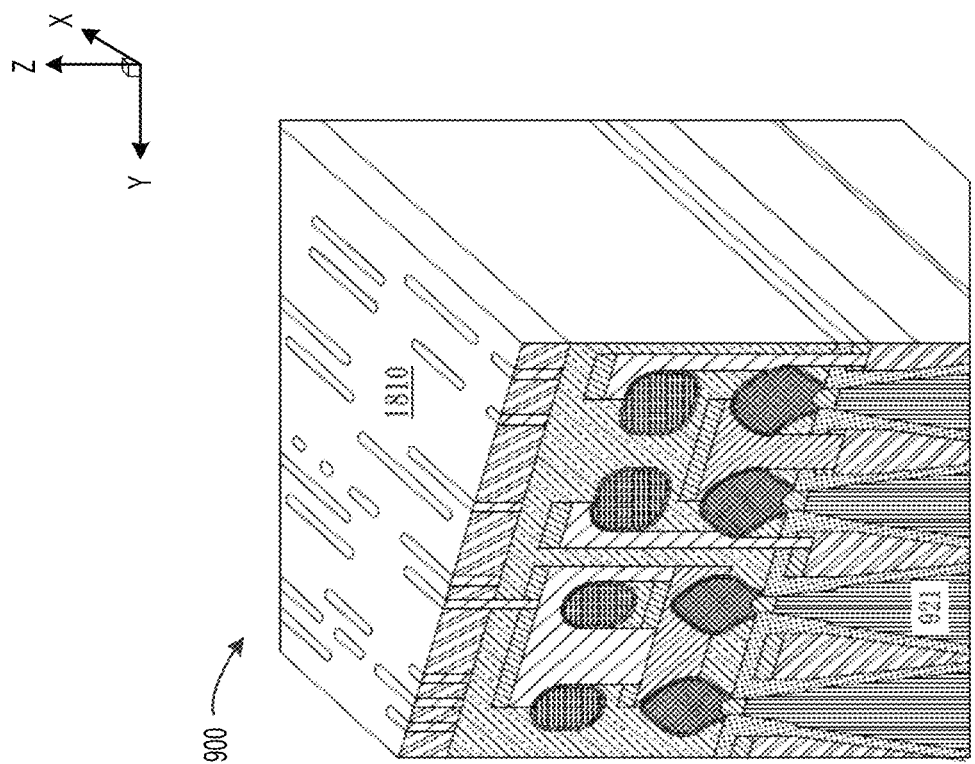

The completed front-end-of-line (FEOL)/middle-of-line (MOL) device cross-section is shown in FIG. 18 where a combination of "narrow" (left) and "wide" (right) nanosheets within a CFET device is shown as needed to maintain optimal drive strength while allowing for necessary gate contacts. For example, the semiconductor structure 900 can include a lower channel structure 942, an upper channel structure 952 formed vertically over the lower channel structure 942, a first transistor device 901 including a lower gate formed around a first portion of the lower channel structure 942, an upper gate formed around a first portion of the upper channel structure 952, and a separation layer formed between and separating the upper gate and the lower gate, and a second transistor device 902 including a common gate formed around a second portion of the lower channel structure 942 and a second portion of the upper channel structure 952, the first portion of the lower channel structure is equal to the first portion of the upper channel structure in width, the second portion of the lower channel structure is equal to the second portion of the upper channel structure in width, and the first portion of the lower channel structure has a first width (e.g. W2 or NW) less than a second width (e.g. W1 or WW) of the second portion of the lower channel structure (referring to FIGS. 3, 4, 10, 17 and 18). In an embodiment, the upper gate is formed all around a cross-section of the upper channel structure 952, the lower gate is formed all around a cross-section of the lower channel structure 942, and the common gate is formed all around cross-sections of the upper channel structure 952 and the lower channel structure 942. In another embodiment, the upper channel structure 952 and the lower channel structure 942 have a channel width transition (e.g. step-like transition 841, as shown in FIG. 8*b*) between the first transistor device 901 and the second transistor device 902, and is positioned at a contacted poly pitch (CPP) (e.g. transition space) (referring to FIG. 8*b*). For example, the step-shaped channel width transition is symmetrical with respect to a central line of the upper channel structure 952 and the lower channel structure 942. In some other embodiments, the semiconductor structure 900 can further include a power rail positioned below the first transistor device 901 and the second transistor device 902, and the power rail has a width corresponding to the widths of the upper channel structure 952 and the lower channel structure 942 (referring to FIGS. 7, 17 and 18). In various embodiments, the semiconductor structure 900 can further include a lower gate contact connected to the lower gate, and a difference between the first width and the second width is sufficient for the lower gate contact to extend from the lower gate to a wiring plane 1810 above the first transistor device 901 (referring to FIGS. 4, 17 and 18). In still other embodiments, the semiconductor structure 900 can further include a third transistor device 903 that is adjacent to at least one of the first transistor device 901 and the second transistor device 902, and the lower channel structure 942 and the upper channel structure 952 at the third transistor device 903 have a third width different from at least one of the first width and the second width.

Tapered devices herein are more than sharing a continuous active channel with one device's output becoming the next device's input. Devices herein include use of narrow devices to afford lower device access in a CFET device (or CFET derivative such as stacked CFET) while maintaining overall drive strength by widening the active channel in all devices where lower gate access is not required. A tapered power rail is formed as a result of applying self-aligned buried power-rail process to tapered device stack. A spacer-based methodology enables tapered devices in leading edge technology nodes at aggressive CPP where single exposure lithography would not provide sufficient image fidelity.

While the tapered device construct is described primarily for lower gate access in CFET, it will be obvious to those skilled in the art that the methodology described here is applicable as well to more conventional power vs performance tuning of logic and memory circuits, for example, but not limited to, selectively widening the active channel only in devices that leverage higher drive strength for improved circuit performance.

Embodiments include a method to pattern a variable width nanosheet structure within a device which allows for transition in the width of the nanosheet to occur outside of the intended gate area such that no process variability of the channel width within the transistor in the integration will have any impact to transistor performance. The transition in nanosheet width can be done across multiple increments within the device. The transition in nanosheet width can be done symmetrically (e.g. with respect to a central line of the upper channel structure and the lower channel structure) or asymmetrically within the device.

A sidewall spacer process is incorporated in order to make these nanosheet width variations within a device where the transition in widths of the nanosheet is based on the transfer of a pattern incorporating a backbone structure, a backbone and sidewall spacer, a backbone and two sidewall spacers can be transferred to a hardmask before transferring to the silicon/silicon germanium multilayer. This process can be both done through a subtractive or additive method. For example, a spacer can be removed from a backbone and sidewall spacer pattern to reduce the width of the intended nanosheets, or an additional sidewall spacer can be formed on an existing backbone or backbone and spacer process to make a wider nansosheet width. The width adjustment of simply cutting away or adding a spacer will promote a step-like transition (90 degree or L-shaped) to the width of the nanosheets. This prevents any corner rounding typical of lithographic width adjustment from being transferred into the silicon/silicon germanium multilayer lattice where it can extend into the transistor area.

Techniques herein can be incorporated across multiple modules in the integration for step-like width transitions including: Nanosheet width transitions, Gate width and gate length transitions, Local interconnect width and length transitions, Metal layer width transitions, including any buried metal layers.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the disclosure. Such variations are intended to be covered by the scope of this disclosure. As such, the foregoing descriptions of embodiments of the disclosure are not intended to be limiting. Rather, any limitations to embodiments of the disclosure are presented in the following claims.

What is claimed is:

1. A semiconductor structure, comprising:
a lower channel structure;
an upper channel structure formed vertically over the lower channel structure;
a first transistor device including a lower gate formed around a first portion of the lower channel structure, an upper gate formed around a first portion of the upper channel structure, and a separation layer formed between and separating the upper gate and the lower gate; and
a second transistor device including a common gate formed around a second portion of the lower channel structure and a second portion of the upper channel structure,
wherein the first portion of the lower channel structure is equal to the first portion of the upper channel structure in width, the second portion of the lower channel structure is equal to the second portion of the upper channel structure in width, and the first portion of the lower channel structure has a first width less than a second width of the second portion of the lower channel structure.

2. The semiconductor structure of claim 1, wherein the upper gate is formed all around a cross-section of the upper channel structure, the lower gate is formed all around a cross-section of the lower channel structure, and the common gate is formed all around cross-sections of the upper channel structure and the lower channel structure.

3. The semiconductor structure of claim 1, wherein the upper channel structure and the lower channel structure have a channel width transition between the first transistor device and the second transistor device.

4. The semiconductor structure of claim 3, wherein the channel width transition is positioned at a contacted poly pitch (CPP).

5. The semiconductor structure of claim 3, wherein the channel width transition is step-shaped.

6. The semiconductor structure of claim 5, wherein the channel width transition is symmetrical with respect to a central line of the upper channel structure and the lower channel structure.

7. The semiconductor structure of claim 1, further comprising a power rail positioned below the first transistor device and the second transistor device, the power rail having a width corresponding to the widths of the upper channel structure and the lower channel structure.

8. The semiconductor structure of claim 1, further comprising:
a lower gate contact connected to the lower gate,
wherein a difference between the first width and the second width is sufficient for the lower gate contact to extend from the lower gate to a wiring plane above the first transistor device.

9. The semiconductor structure of claim 1, further comprising:
a third transistor device that is adjacent to at least one of the first transistor device and the second transistor device,
wherein the lower channel structure and the upper channel structure at the third transistor device have a third width different from at least one of the first width and the second width.

10. A method of manufacturing a semiconductor structure, the method comprising:
forming a mandrel over a semiconductor material layer stack;
forming at least a sidewall spacer on a portion of the mandrel;
using the mandrel and the at least a sidewall spacer to define channel structures in the semiconductor material layer stack;
forming from the semiconductor material layer stack a first transistor device that includes a first portion of the channel structures that corresponds to a first portion of the sidewall spacer and the portion of the mandrel; and
forming from the semiconductor material layer stack a second transistor device that includes a second portion of the channel structures that corresponds to a second portion of the sidewall spacer and the portion of the mandrel,
wherein the first transistor device and the second transistor device are connected by a third portion of the channel structures that corresponds to a remaining of the mandrel.

11. The method of claim 10, wherein forming at least a sidewall spacer includes forming two sidewall spacers.

12. The method of claim 11, wherein the two sidewall spacers are formed on two sides of the portion of the mandrel.

13. The method of claim 11, wherein the two sidewall spacers are formed on one side of the portion of the mandrel.

14. The method of claim 10, wherein forming at least a sidewall spacer on a portion of the mandrel includes:
forming at least a first sidewall spacer on a portion of the mandrel; and
removing a portion of the at least a first sidewall spacer that is formed on a remaining of the mandrel.

15. A method of manufacturing a semiconductor structure, the method comprising:
forming a lower channel structure;
forming an upper channel structure vertically over the lower channel structure;
forming a first transistor device that includes a lower gate formed around a first portion of the lower channel structure, an upper gate formed around a first portion of the upper channel structure, and a separation layer formed between and separating the upper gate and the lower gate; and forming a second transistor device that includes a common gate formed around a second portion of the lower channel structure and a second portion of the upper channel structure, wherein the first portion of the lower channel structure is equal to the first portion of the upper channel structure in width, the second portion of the lower channel structure is equal to the second portion of the upper channel structure in width, and the first portion of the lower channel structure has a first width less than a second width of the second portion of the lower channel structure.

16. The method of claim 15, wherein the upper channel structure and the lower channel structure have a channel width transition between the first transistor device and the second transistor device.

17. The method of claim 16, wherein the channel width transition is positioned at a CPP.

18. The method of claim 16, wherein the channel width transition is step-shaped.

19. The method of claim 15, further comprising:

forming a lower gate contact connected to the lower gate, wherein a difference between the first width and the second width is sufficient for the lower gate contact to extend from the lower gate to a wiring plane above the first transistor device.

20. The method of claim 15, further comprising:

forming a third transistor device that is adjacent to at least one of the first transistor device and the second transistor device, wherein the lower channel structure and the upper channel structure at the third transistor device have a third width different from at least one of the first width and the second width.

* * * * *